(12) United States Patent
Kerber et al.

(10) Patent No.: US 7,704,853 B2
(45) Date of Patent: Apr. 27, 2010

(54) METHOD FOR THE ELIMINATION OF THE EFFECTS OF DEFECTS ON WAFERS

(75) Inventors: Martin Kerber, Munich (DE); Nikolaos Hatzopoulos, Dresden (DE)

(73) Assignee: Infineon Technologies AG, Munich (DE)

( * ) Notice: Subject to any disclaimer, the term of this patent is extended or adjusted under 35 U.S.C. 154(b) by 166 days.

(21) Appl. No.: 11/389,485

(22) Filed: Mar. 24, 2006

(65) Prior Publication Data

US 2006/0240638 A1    Oct. 26, 2006

Related U.S. Application Data

(63) Continuation of application No. PCT/DE2004/002066, filed on Sep. 14, 2004.

(30) Foreign Application Priority Data

Sep. 25, 2003    (DE) ................. 103 44 388

(51) Int. Cl.
*H01L 21/76* (2006.01)
(52) U.S. Cl. ................ 438/430; 257/E21.548
(58) Field of Classification Search .......... 438/585, 438/424, 437
See application file for complete search history.

(56) References Cited

U.S. PATENT DOCUMENTS

| | | | |
|---|---|---|---|
| 3,998,673 A * | 12/1976 | Chow | 438/429 |
| 4,659,400 A | 4/1987 | Garbis et al. | |
| 6,130,140 A * | 10/2000 | Gonzalez | 438/430 |
| 6,352,897 B1 * | 3/2002 | Sung | 438/296 |
| 6,448,157 B1 | 9/2002 | Okonogi et al. | |
| 6,500,732 B1 | 12/2002 | Henley et al. | |
| 6,509,248 B1 | 1/2003 | González | |
| 2002/0127766 A1 | 9/2002 | Ries et al. | |
| 2003/0068502 A1 | 4/2003 | Togashi et al. | |

FOREIGN PATENT DOCUMENTS

| | | |
|---|---|---|
| JP | 10-247630 A | 9/1998 |
| WO | WO 02/052643 A2 | 7/2002 |

* cited by examiner

*Primary Examiner*—W. David Coleman
*Assistant Examiner*—Sonya D McCall-Shepard
(74) *Attorney, Agent, or Firm*—Slater & Matsil, L.L.P.

(57) ABSTRACT

A method eliminates effects of defects on wafers caused by cavities adjacent to the surface of a semiconductor (e.g., silicon) wafer. A first insulating layer is applied to the surface of the semiconductor wafer and into the cavities adjacent to the surface. The applied first insulating layer is covered with a sacrificial layer. A selective back-etching of the sacrificial layer is carried out, such that the cavities adjacent to the surface remain filled with the sacrificial layer. A second insulating layer is applied directly to the first insulating layer and, in a subsequent method step, a conducting layer is applied to the second insulating layer.

26 Claims, 1 Drawing Sheet

METHOD FOR THE ELIMINATION OF THE EFFECTS OF DEFECTS ON WAFERS

This application is a continuation of co-pending International Application No. PCT/DE2004/0002066, filed Sep. 14, 2004, which designated the United States and was not published in English, and which is based on German Application No. 103 44 388.6, filed Sep. 25, 2003, both of which applications are incorporated herein by reference.

TECHNICAL FIELD

The invention relates to a method for the elimination of the effects of defects on wafers that are caused by cavities adjacent to the surface of the silicon wafer.

BACKGROUND

During the production of silicon single crystals, a supersaturation of lattice vacancies occurs during the pulling of the single crystals from the melt and subsequent cooling. These lattice vacancies combine to form cavities that, depending on the pulling process properties of pulling speed and cooling rate, have a mean size of approx. 100 nm and a density distribution that is dependent on the radius. Even if only a relatively small proportion of the crystal is disrupted, these crystal structural defects can nevertheless have a considerable influence on various properties of the crystal.

Deviations of this type may, for example, be octahedral cavities, known as "crystal originated pits," or COPs for short, which form in the crystal as a result of vacancy agglomerations. Some of these cavities are randomly located at the wafer surface following the sawing and polishing of the silicon single crystal.

In MOS structures, $SiO_2$ is used as electrically insulating gate oxide. Therefore, the reliability of the gate oxide is crucial to the reliability of electronic devices. Grown-in cavities that are randomly intersected by the wafer surface after the single crystal has been sawn into individual wafers, may locally reduce the insulating properties of the gate oxide that has been applied to the entire wafer surface. The reason for this is that the oxide has thin points at the edges and/or corners located within the cavity. On account of these thin points, the breakdown voltage is locally reduced. During continuing operation of the chip, a gate oxide breakdown can occur predominantly at these thin points, since the field strength is higher at these points. A component that is located at this point can thereby stop functioning.

Defects of this type occur with a mean density of $10\ cm^{-2}$ in the silicon structure and lead to an increase in the failure rate. Standard semiconductor chips, depending on their active gate oxide area, which is on average $1\ mm^2$, are affected by this failure mechanism to the extent of approximately 10%. Therefore, it is necessary to use a base material with a lower defect density. An improvement of this type in the surface properties of a silicon wafer is possible, for example, by using a complex crystal pulling process (perfect silicon) and/or an aftertreatment (high-temperature anneal). Cavities of this type can be closed up, in such a way as to eliminate their effect, by epitaxial growth of a single-crystal silicon thin film. However, all these measures lead to undesirable cost increases and/or are dependent on the manufacturer of the base material.

SUMMARY OF THE INVENTION

The invention is therefore based on the object of providing a method for the elimination of the effects of defects on wafers that protect against gate oxide breakdowns at thin points and reduces production costs.

According to the invention, in a method for the elimination of the effects of defects on wafers of the type described in the introduction, the object is achieved by virtue of the fact that in a first method step a first insulation layer is applied to the surface of the silicon wafer and in the cavities adjacent to the surface, that in a second method step the applied first insulation layer is covered with a sacrificial layer, that in a third method step the sacrificial layer is selectively etched back in such a manner that the cavities adjacent to the surface remain filled by the sacrificial layer, that in a fourth method step a second insulation layer is applied directly to the first insulation layer, and that in a subsequent method step a conductive layer is applied to the second insulation layer.

According to the invention, in a method for the elimination of the effects of defects on wafers of the type described in the introduction, the object is also achieved by virtue of the fact that in a first method step a first insulation layer is applied to the surface of the silicon wafer and in the cavities adjacent to the surface, that in a second method step the applied first insulation layer is covered with a sacrificial layer, that in a third method step the sacrificial layer is selectively etched back in such a manner that the cavities adjacent to the surface remain filled by the sacrificial layer, that in a fourth method step the first insulation layer is at least partially removed over its height, and then a second insulation layer is applied to the surface, which has been altered by the preceding method steps, and that in a subsequent method step a conductive layer is applied to the second insulation layer.

To avoid thin points, which may form for example as a result of octahedral cavities (COPs) at the surface of a silicon wafer, prior to the application of the insulation layer, which determines the function and is also referred to as the gate oxide layer, a first insulation layer is applied. This layer is applied in such a manner that both the surface of the silicon wafer, which is leveled by a polishing operation and the inner surfaces of all the cavities that are open toward the surface of the silicon wafer, are covered by the first insulation layer.

In a second method step, the first insulation layer is covered with a sacrificial layer. In this method step, the open cavities or the cavities that have been cut into are filled with the material of the sacrificial layer. By way of example, polysilicon, silicon nitride or other semiconductor-compatible materials are used for the sacrificial layer.

In a subsequent selective etching step, the sacrificial layer is etched back. This etchback is carried out in such a manner that the material of the sacrificial layer remains within all the filled cavities but is removed from the remainder of the first insulation layer.

In the subsequent fourth method step, the second insulation layer is grown directly onto the semiconductor surface, which has been prepared in this manner, or alternatively the first insulation layer is partially or completely removed first of all, and then the second insulation layer is grown on. In both cases, this method step produces the function-determining insulation layer.

In a step that follows the fourth method step, a conductive layer is applied directly to the second insulation layer.

In one embodiment of the invention, it is provided that the first insulation layer is completely removed.

In addition to the possibility of building up the second insulation layer on the first, it is also possible for the first insulation layer to be completely removed and then for the second insulation layer to be applied as the function-determining insulation layer.

In one configuration of the invention, it is provided that the first and/or second insulation layer is an oxide layer.

To produce the insulation layer in accordance with the method, by way of example, a silicon oxide layer (e.g., $SiO_2$) is used for one or both insulation layers.

In a further configuration of the invention, it is provided that the sacrificial layer consists of polysilicon.

In a particular embodiment of the invention, it is provided that the sacrificial layer consists of silicon nitride.

The sacrificial layer in accordance with the method may, for example, comprise polysilicon, silicon nitride or another semiconductor-compatible material.

In one configuration of the invention, it is provided that the conductive layer comprises polysilicon.

In one embodiment of the invention, it is provided that the conductive layer comprises a metal.

Materials such as polysilicon or a metal can be used for the conductive layer that is to be applied to the second insulation layer.

BRIEF DESCRIPTION OF THE DRAWINGS

The invention is to be explained in more detail below with reference to an exemplary embodiment. In the associated drawings.

The following list of reference symbols can be used in conjunction with the figures:
1 Silicon wafer
2 Cavity
3 First insulation layer
4 Sacrificial layer
5 Second insulation layer
6 Conductive layer

DETAILED DESCRIPTION OF ILLUSTRATIVE EMBODIMENTS

Figure 1:
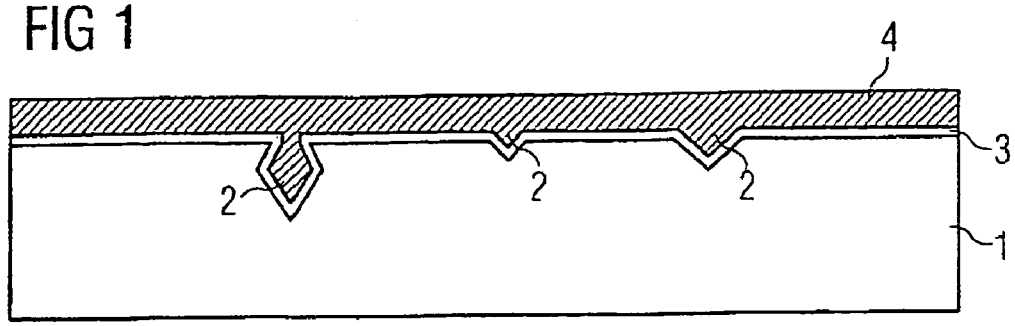
FIG. 1 shows a section through a silicon wafer having a partially applied structure according to the invention.

FIG. 1 shows a silicon wafer 1 following sawing and polishing of the silicon single crystal. At the surface of the wafer there are a plurality of cavities 2 that have been uncovered by the previous method steps and are open toward the surface of the wafer.

To avoid thin points in the gate oxide layer, in a first method step a first insulation layer 3 consisting of silicon oxide is applied. This layer is applied in such a manner that both that surface of the silicon wafer 1, which has been leveled by the polishing operation, and the inner surfaces of all the cavities 2, which are open toward the surface of the silicon wafer 1, are covered by the first insulation layer 3.

In the subsequent second method step, a sacrificial layer 4, comprising for example polysilicon or silicon nitride, is applied. This sacrificial layer 4 is applied in such a manner that the cavities 2 are also filled with the material of the sacrificial layer 4, as illustrated in FIG. 1. It is preferable to use undoped, amorphous or polycrystalline silicon for the sacrificial layer 4. During the filling of the cavities with the material of the sacrificial layer 4, the situation may arise whereby the cavities 2 are only closed up but not completely filled. These residual cavities that remain are permissible in the method according to the invention, since they have no effect on the subsequent formation of the second insulation layer without any thin points.

Figure 2:
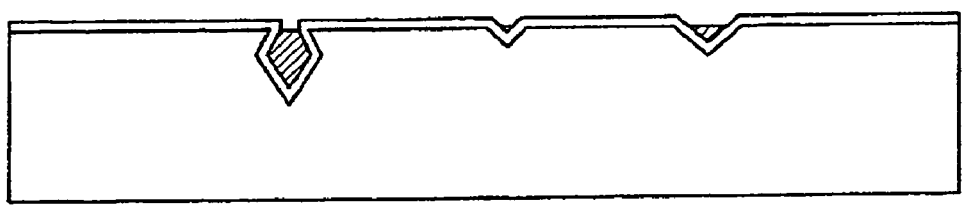
FIG. 2 shows a section through a silicon wafer having a partially applied structure according to the invention following an etchback operation.

In the third method step, the sacrificial layer 4 is etched back. It is preferable for the etchback to be carried out by a gentle, highly selective wet-etch step. This etchback operation is set in such a way that the material of the sacrificial layer 4 remains only as a filling in the cavities 2 but not on the remainder of the surface, as illustrated in FIG. 2.

Figure 3:
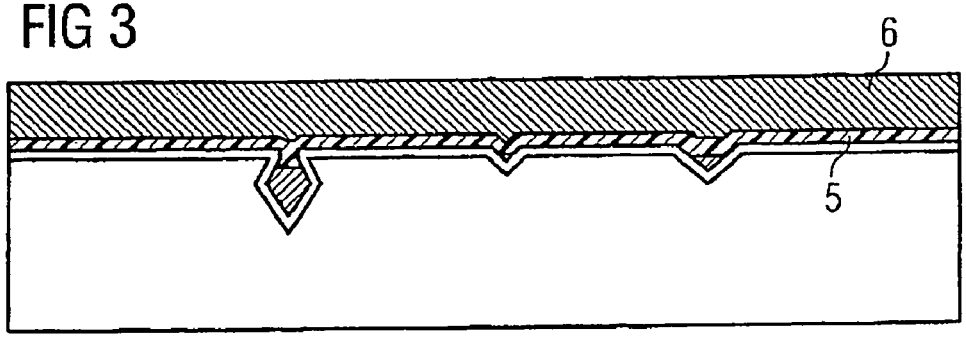
FIG. 3 shows a section through a silicon wafer having a fully applied structure according to the invention.

In the fourth method step, a second insulation layer 5 is applied directly to the first insulation layer and the filled cavities 2, as illustrated in FIG. 3. Another variant consists in the wet-chemical removal of the first insulation layer 3 at the surface of the wafer with the exception of the cavity regions 2 and the subsequent application of a second insulation layer 5. The second insulation layer 5 may also be silicon oxide.

Therefore, either the first insulation layer 3, for example a gate oxide, is oxidized up to a target thickness, or a completely new gate oxide layer is produced. During this operation, oxidation is also carried out on the cavities 2 that have been filled, for example, with a polycrystalline silicon filling. However, since the oxidation rate on a polycrystalline silicon filling is higher than on the first insulation layer 3, minor overetching in the wet-chemical etching operation is compensated for. These two alternatives for the fourth method step allow better adaptation to different manufacturing technologies.

Following this method step, a conductive layer 6 is applied to the second insulation layer 5. This conductive layer 6 may be composed, for example, of polysilicon or a metal.

The formation, in accordance with the method, of a function-determining gate oxide layer, which comprises either the first insulation layer 3 and the second insulation layer 5, or only the second insulation layer 5, avoids the damaging effect of thin points in the regions of the cavities 2 and reduces the probability of a gate oxide breakdown.

What is claimed is:

1. A method of making a semiconductor device, the method comprising:
    providing a semiconductor wafer, the wafer including a plurality of cavities adjacent to a surface of the semiconductor wafer, the plurality of cavities comprising crystal defects;
    forming a first insulation layer over the surface of the semiconductor wafer and in the plurality of cavities adjacent to the surface, the first insulation layer extending over a top surface of the semiconductor wafer and in the plurality of cavities;
    covering the first insulation layer with a sacrificial layer, the sacrificial layer extending over the first insulation layer over the top surface of the semiconductor wafer and in the plurality of cavities;
    selectively etching back the sacrificial layer in such a manner that the plurality of cavities adjacent to the surface remains filled with the sacrificial layer;
    forming a second insulation layer directly on the first insulation layer; and
    forming a conductive layer over the second insulation layer.

2. The method as claimed in claim 1, wherein the semiconductor wafer comprises a silicon wafer.

3. The method as claimed in claim 1, wherein the first and/or second insulation layer comprises an oxide layer.

4. The method as claimed in claim 1, wherein the sacrificial layer comprises polysilicon.

5. The method as claimed in claim 1, wherein the sacrificial layer comprises silicon nitride.

6. The method as claimed in claim 1, wherein the conductive layer comprises polysilicon.

7. The method as claimed in claim 1, wherein the conductive layer comprises a metal.

8. The method as claimed in claim 1, wherein each of the plurality of cavities comprise a mean size of approximately 100 nm.

9. The method as claimed in claim 1, wherein at least one of the defects comprises a crystal originated pit.

10. A method of making a semiconductor device, the method comprising:
   providing a semiconductor wafer that includes cavities adjacent to a surface of the semiconductor wafer, the cavities comprising crystal defects;
   forming a first insulation layer over the surface of the semiconductor wafer and in the cavities adjacent to the surface, the first insulation layer extending over a top surface of the semiconductor wafer and in the cavities;
   covering the first insulation layer with a sacrificial layer, the sacrificial layer extending over the first insulation layer over the top surface of the semiconductor wafer and in the cavities;
   selectively etching back the sacrificial layer in such a manner that the cavities adjacent to the surface remain filled with the sacrificial layer;
   at least partially removing the first insulation layer;
   forming a second insulation layer over the surface of the semiconductor wafer; and
   forming a conductive layer over the second insulation layer.

11. The method as claimed in claim 10, wherein at least partially removing the first insulation layer comprises completely removing the first insulation layer.

12. The method as claimed in claim 10, wherein the semiconductor wafer comprises a silicon wafer.

13. The method as claimed in claim 10, wherein the first and/or second insulation layer comprises an oxide layer.

14. The method as claimed in claim 10, wherein the sacrificial layer comprises polysilicon.

15. The method as claimed in claim 10, wherein the sacrificial layer comprises silicon nitride.

16. The method as claimed in claim 10, wherein the conductive layer comprises polysilicon.

17. The method as claimed in claim 10, wherein the conductive layer comprises a metal.

18. The method as claimed in claim 10, wherein each of the cavities comprises a mean size of approximately 100 nm.

19. The method as claimed in claim 10, wherein at least one of the defects comprises a crystal originated pit.

20. A method of making a semiconductor device, the method comprising:
   providing a silicon wafer that includes cavities adjacent to a surface of the silicon wafer, the cavities comprising crystal defects;
   forming a first oxide layer over the surface of the silicon wafer and in the cavities adjacent to the surface, the first oxide layer extending over a top surface of the silicon wafer and in the cavities;
   covering the first oxide layer with a sacrificial polysilicon layer, the sacrificial polysilicon layer extending over the first oxide layer over the top surface of the silicon wafer and in the cavities;
   selectively etching back the sacrificial polysilicon layer in such a manner that the cavities adjacent to the surface remain filled with the sacrificial polysilicon layer;
   forming a second oxide layer over the silicon wafer; and
   forming a conductive layer over the second oxide layer.

21. The method as claimed in claim 20, further comprising at least partially removing the first oxide layer before forming the second oxide layer.

22. The method as claimed in claim 20, wherein forming the second oxide layer over the silicon wafer comprises forming the second oxide layer in direct contact with the first oxide layer.

23. The method as claimed in claim 20, wherein the conductive layer comprises polysilicon.

24. The method as claimed in claim 20, wherein each of the cavities comprises a mean size of approximately 100 nm.

25. The method as claimed in claim 20, wherein at least one of the defects comprises a crystal originated pit.

26. The method as claimed in claim 21, wherein at least partially removing the first oxide layer comprises completely removing the first oxide layer.

* * * * *